(12) United States Patent
Yamada et al.

(10) Patent No.: US 6,984,883 B2
(45) Date of Patent: Jan. 10, 2006

(54) SEMICONDUCTOR POWER MODULE

(75) Inventors: Junji Yamada, Tokyo (JP); Seiji Saiki, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 109 days.

(21) Appl. No.: 10/671,592

(22) Filed: Sep. 29, 2003

(65) Prior Publication Data

US 2004/0113258 A1    Jun. 17, 2004

(30) Foreign Application Priority Data

Dec. 12, 2002   (JP) ............................... 2002-360730

(51) Int. Cl.
*H01L 23/48* (2006.01)
(52) U.S. Cl. .................. 257/690; 257/691; 257/678; 257/701; 257/584; 361/728; 361/772; 174/52.1; 174/52.4
(58) Field of Classification Search ................ 257/690, 257/691, 701, 584, 678; 361/728, 772; 174/52.1, 174/52.4
See application file for complete search history.

(56) References Cited

U.S. PATENT DOCUMENTS

| | | | | |
|---|---|---|---|---|
| 4,704,320 A | * | 11/1987 | Mizunoya et al. | 428/210 |
| 4,727,454 A | * | 2/1988 | Neidig et al. | 361/689 |
| 5,328,751 A | * | 7/1994 | Komorita et al. | 428/209 |
| 5,466,969 A | * | 11/1995 | Tsunoda | 257/706 |
| 5,521,437 A | * | 5/1996 | Oshima et al. | 257/701 |
| 5,869,890 A | * | 2/1999 | Nishiura et al. | 257/705 |
| 5,956,231 A | * | 9/1999 | Yamada et al. | 361/728 |
| 5,967,858 A | | 10/1999 | Yamada | 439/736 |
| 6,787,900 B2 | * | 9/2004 | Shinohara et al. | 257/718 |

FOREIGN PATENT DOCUMENTS

| | | | |
|---|---|---|---|
| JP | 5-15439 | | 2/1993 |
| JP | 10-173126 | | 6/1998 |
| JP | 11233696 A | * | 8/1999 |
| JP | 2001-68623 | | 3/2001 |
| JP | 2002043510 A | * | 2/2002 |

* cited by examiner

*Primary Examiner*—Tom Thomas
*Assistant Examiner*—Chris C. Chu
(74) *Attorney, Agent, or Firm*—Oblon, Spivak, McClelland, Maier & Neustadt, P.C.

(57) ABSTRACT

An insulating substrate (17) includes a surface conductive layer (25) fixedly laminated on a surface of the plate-like semiconductor body (21) via a surface side fixing member (24, 26). The surface side fixing member (24, 26) includes a first fixing portion (26) for fixing one part (25a) of the surface conductive layer (25) located underneath the joint portion (15) of the electrode terminal (14), and a second fixing portion (24) for fixing the other part (25b) of the surface conductive layer (25) which is not located underneath the joint portion (15), and a fixing strength exhibited by the first fixing portion (26) is smaller than that exhibited by the second fixing portion (24).

8 Claims, 4 Drawing Sheets

SEMICONDUCTOR POWER MODULE

BACKGROUND OF THE INVENTION

1. Field of the Invention

The present invention generally relates to a power semiconductor device, and particularly to a joint assembly structure of an insulating substrate and electrode terminals of a power semiconductor device used in a power converter or the like.

2. Description of the Prior Art

A power semiconductor device (hereinafter, referred to as "semiconductor power module", or more simply "power module") is generally arranged to convert a direct current input into an alternating current output of an arbitrary frequency by using a semiconductor element, and is employed in, for example, an inverter used for motor control or different purposes and also for use in an uninterruptible power source (UPS).

In a conventional semiconductor power module, a semiconductor (element) chip is fixedly mounted onto an insulating substrate and one end of each electrode terminal is fixedly joined to a specified portion on an upper surface portion of the insulating substrate through a joint material, and an electrode terminal plate is extended to be directly connected to a circuit pattern.

In order for preventing a breakage of a joint portion between the electrode terminal and the insulating substrate in the presence of a stress caused through temperature changes or similar factors, an S-shaped structure is employed for the electrode terminal that is fixedly attached to the insulating substrate to thereby achieve a stress relaxation structure (see, for instance, Patent Reference 1: Japanese Utility Model Laid-Open Publication No. 5-15439 (1993)).

There is also disclosed an arrangement for achieving stress relaxation by extending each electrode terminal in a plate beam-like manner (see, for instance, Patent Reference 2: Japanese Patent Laid-Open Publication No. 10-173126 (1998)).

In another disclosed arrangement, a clearance is provided in a non-fixed condition between a surface conductive pattern of the insulating substrate and the insulating body, and electrode terminals are joined to the conductive pattern to thereby achieve the stress relaxation. Alternatively, such a clearance is formed to be large so as to easily discharge residues occurring during manufacture of the power module (see, for instance, Patent Reference 3: Japanese Patent Laid-Open Publication No. 2001-68623).

When assembling such a semiconductor module of the above arrangement, the electrode terminal plates and the semiconductor chip are electrically connected where the electrode terminal plates form a laminated structure together with the insulating layer disposed underneath thereof while the electrode terminal plates are insulated from each other.

Each electrode terminal plate extends outside of a resin case to form, for instance, a P terminal, an N terminal or an alternating current terminal of main circuit terminals for external connection, on an upper surface of the semiconductor power module. It is noted that a filler material such as silicon gel is filled in an interior space surrounded by the resin case.

However, in the conventional semiconductor power module as disclosed in Patent Reference 1, stress relaxation is achieved by forming electrode terminals to be of S-shape for preventing breakage of joint portions between electrode terminals and the insulating substrate. Therefore, there arise drawbacks such that the electrode terminals will be of elongated shape in the height direction which is inconvenient in view of reducing the size of the power module and which also leads to cost up of the electrode terminals.

In the arrangement as disclosed in Patent Reference 2, stress relaxation is achieved by extending the electrode terminals in a plate beam-like manner such that the electrode terminals become long in the horizontal direction. This is problematically inconvenient when considering reduction in size of the power module.

On the other hand, in the arrangement disclosed in Patent Reference 3, the electrode terminals are joined with the surface conductive pattern of the insulating substrate while the surface conductive pattern and the insulating body are in non-fixed condition, and therefore fluid or gas used during manufacturing processes of the power module will remain in the non-fixed portions. Thus, there arise drawbacks such that, when such residues are dispersed in the power module during use thereof to thereby affect characteristics of the semiconductor chip.

In an arrangement in which the clearance of the non-fixed portion is formed to be large for easily discharging such residues during manufacture of the power module, there arise drawbacks such that thermal conduction for discharge heat from the metallic substrate generated in joining of the electrode terminals is undesirably blocked by the clearances of non-joined portions, which makes the joining of electrode terminals difficult and accordingly degrade the production efficiency.

SUMMARY OF THE INVENTION

The present invention has been made for solving the above problems, and it is an object of the present invention to provide a semiconductor power module that may be manufactured to be of a small size and at a low cost while preventing a crack at a solder-joint portion and flexes or fractures of an insulating substrate and also preventing fluid substances used in manufacturing processes from remaining and discharging in the usage thereof.

For achieving the above object, the semiconductor power module according to the present invention includes a metallic base and an insulating substrate fixedly laminated on the metallic base. The insulating substrate includes a plate-like insulating body and a surface conductive layer fixedly laminated on a surface of the plate-like semiconductor body via two kinds of surface side fixing members having different fixing strengths. The power module further includes a power semiconductor element mounted on the insulating substrate and an electrode terminal plate fixed to the insulating substrate via a joint portion.

In this construction, the two kinds of the surface side fixing members include a first fixing portion for fixing one part of the surface conductive layer located underneath the joint portion of the electrode terminal, and further includes a second fixing portion for fixing the other part of the surface conductive layer which is not located underneath the joint portion, and a fixing strength exhibited by the first fixing portion is smaller than that exhibited by the second fixing portion.

Thus, by setting different fixing strengths for the right and left region of the surface side fixing member and by fixing the electrode terminals and the insulating body immediately below thereof with a weak strength, no substances will reside during manufacturing processes since a fixed condition is reliably established in manufacturing stages of the power module.

Further, by forming a stress relaxing structure in which only the first fixing portion having a weak fixing force is easily peeled off upon receipt of an initial stress when using the product, breakage of the joint portion of the electrode terminal can be prevented. Since it is possible to omit forming a stress relaxing structure at the electrode terminals themselves, the electrode terminals can be formed at a low cost, enabling to provide a power module of a low cost, accordingly.

BRIEF DESCRIPTION OF THE DRAWINGS

These and other objects and features of the present invention will be readily understood from the following detailed description taken in conjunction with preferred embodiments thereof with reference to the accompanying drawings, in which.

DETAILED DESCRIPTION OF THE PREFERRED EMBODIMENTS

Figure 1:
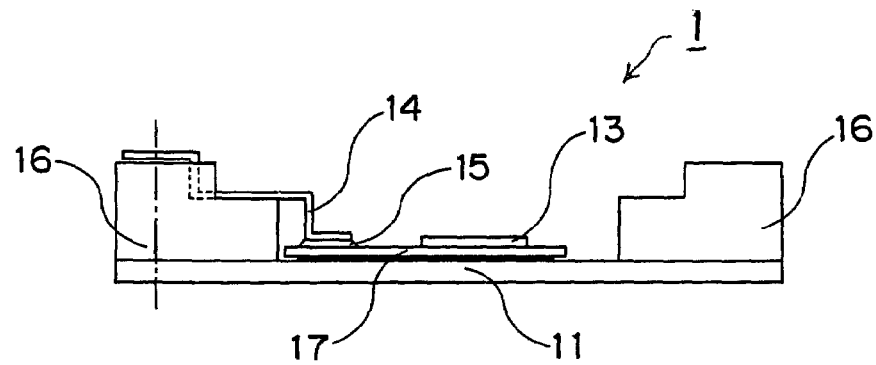
FIG. 1 is side-sectional view illustrating an entire structure of a semiconductor power module according to a first embodiment of the present invention.

Before the description proceeds, it is to be noted that, since the basic structures of the preferred embodiments are in common, like parts are designated by the same reference numerals throughout the accompanying drawings, and repetitive explanations are omitted for simplification purposes.

Embodiments of the present invention will now be explained with reference to the accompanying drawings. While the embodiments of the present invention are explained as an example of using a semiconductor power module shown in the drawings, the present invention is not limited to this arrangement. The present invention is also applicable to a case of using other complex types of semiconductor devices in which a plurality of semiconductor chips are mounted in a single package.

(Embodiment 1)

Figure 2:
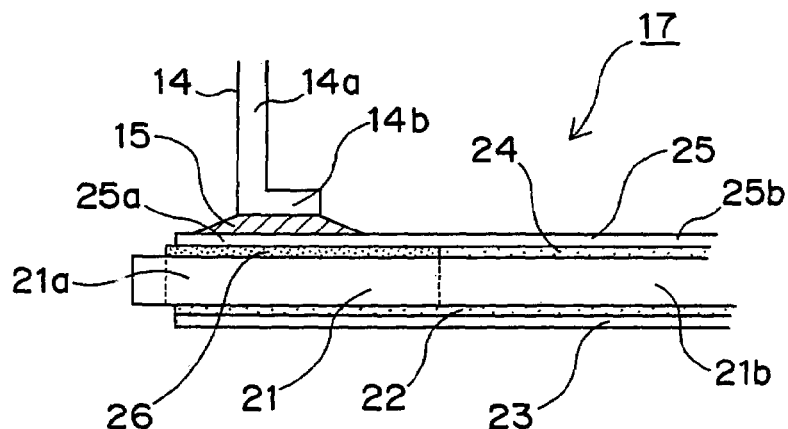
FIG. 2 is an enlarged sectional view illustrating an essential part of a structure of an insulating substrate shown in FIG. 1.
Figure 3:
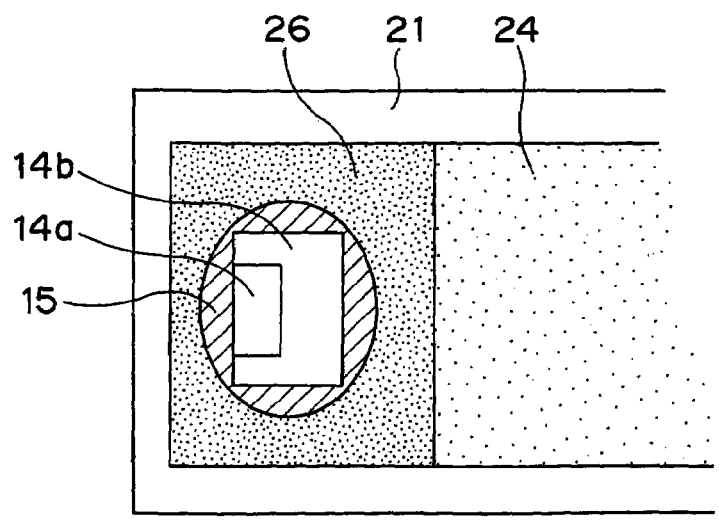
FIG. 3 is a perspective top plan view of an essential part of FIG. 2.

The first embodiment will be now explained with reference to FIGS. 1 to 3. FIG. 1 is side-sectional view illustrating an entire structure in section of a semiconductor power module according to the first embodiment of the present invention. FIG. 2 is an enlarged sectional view illustrating an essential part of a basic structure of an insulating substrate shown in FIG. 1, and FIG. 3 is a perspective top plan view of an essential part shown in FIG. 2.

A major different point between a semiconductor power module 1 according to the first embodiment of the present invention and a conventional semiconductor power module resides in the following fact. That is, in the first embodiment, an insulating substrate structure is constructed in that, in a joint portion between a surface conductive layer on the insulating substrate and an insulating body thereof, a fixing strength of an area immediately below a connected part of an electrode terminal plate on the insulating substrate is set to be smaller than that of the other area of the joint portion.

In the semiconductor power module 1 as illustrated in FIG. 1, reference numeral 11 denotes a metallic base of Cu or other material, 17 an insulating substrate adhered onto an upper surface of the metallic base in a laminated structure, 13 a semiconductor chip (element) such as an IGBT chip fixedly mounted onto the insulating substrate 17 with a soldering material or the like, 14 an electrode terminal plate, and 16 a resin case for protection provided on the metallic base 11.

A lower end of the electrode terminal plate 14 is fixedly joint to a specified portion on the upper surface portion of the insulating substrate 17 through a conductive joint material 15 such as a solder while the other end thereof is fixed and inserted to the resin case 16. A silicon resin gel or a like material is filled in the resin case 16 for protecting the semiconductor chip.

In the basic structure of the insulating substrate 17 as illustrated in FIGS. 2 and 3, reference numeral 21 denotes a plate-like insulating body, 23 a lower conductive layer that is fixedly formed onto the rear surface (downward side in the drawings) of the plate-like insulating body 21 via a lower fixing layer 22, and 25 a conductive pattern of an upper conductive layer that is fixedly formed onto the upper surface (upward side in the drawings) of the plate-like insulating body 21 via an upper fixing layer 24.

The conductive pattern of the upper conductive layer 25 may be made of Cu or Al material. The lower fixing layer 22 and the upper fixing layer 24 may be formed of the same material (which is referred to as "first brazing material", hereinbelow), and a material of Al—Si, Ag—Cu or Ag—Cu—Ti may be used as the first brazing material. The joint of the upper and lower conductive layers 25 and 23 to the plate-like insulating body 21 may be constructed by a known active metal joint method or direct joint method.

The electrode terminal plate 14 may be formed by press molding or etching process of, for example, a Cu plate or Al plate plated with Ni, and the joint material 15 may be a soldering material of such as Sn—Pb type, Pb—In type or Ag—Sn type. The plate-like insulating body 21 may be formed as a ceramic substrate made of alumina ($Al_2O_3$) or aluminum nitride (AlN).

In the above arrangement, the side-sectional shape of the electrode terminal plate 14 has a L-shaped beam structure which is comprised of a vertical extending portion 14a and a base portion 14b, where the base portion 14b is fixed onto a surface of a first conductive portion 25a of the upper conductive (pattern) layer 25 via the joint material 15. The first conductive portion 25a corresponds to a region of the upper conductive layer 25 underneath the base portion 14b. A region of the upper conductive layer 25 other than the first conductive portion 25a is referred to as "second conductive portion 25b", hereinbelow.

In the present embodiment, a specified fixing member 26 (referred to as "first fixing member", hereinbelow) is interposed between the first conductive portion 25a of the upper conductive (pattern) layer 25 and a first insulating body portion 21a of the plate-like insulating body 21, where the first insulating body portion 21a corresponds to a region of the plate-like insulating body 21 underneath the base portion 14b of the electrode terminal plate 14. A region of the plate-like insulating body 21 other than the first insulating body portion 21a is referred to as "second insulating body portion 21b", hereinbelow.

Thus, the bonding between the first conductive portion 25a and the first insulating body portion 21a is implemented by the first fixing member 26.

On the other hand, the upper fixing layer 24 serving as a second fixing member is interposed between the second conductive portion 25b of the upper conductive (pattern) layer 25 and the second insulating body portion 21b of the plate-like insulating body 21.

Thus, the bonding between the second conductive portion 25b and the second insulating body portion 21b is implemented by the second fixing member 24 (i.e., the upper fixing layer 24).

Specifically, in the insulating substrate structure 17, a fixing strength by the first fixing member 26 is set to be smaller than that by the second fixing member 24. As the first fixing member 26, there may be used an active metal or the like material having a weak joining force. In this construction, the first fixing member 26 and the second fixing member 24 are closely contacted with each other at a boundary portion therebetween in a sealed condition with respect to an exterior of the device.

Thus, in the structure of fixing the electrode terminal plate 14 onto the first insulating body portion 21a of the plate-like insulating body 21, since the fixing strength by the first fixing member 26 is set to be smaller than that by the second fixing member 24, the conductive layer 25 is reliably fixed to the insulating body 21 at a stage of manufacturing the power module, and there remain no substance generated in the manufacturing process.

Moreover, in the present embodiment, the insulating substrate structure is constructed to have a stress relaxing structure in which only the first fixing member 26 having a weak fixing force can be easily peeled when an initial stress is generated in a usage of the product. With this arrangement, breakage of the joint portion 15 of the electrode terminal plate is effectively prevented while the electrode terminals can be arranged at a low cost since it is not necessary to form a stress relaxing structure such as a S-shape of an electrode terminal plate, and it is accordingly possible to reduce a cost of a power module compared to a conventional one.

(Embodiment 2)

Figure 4:
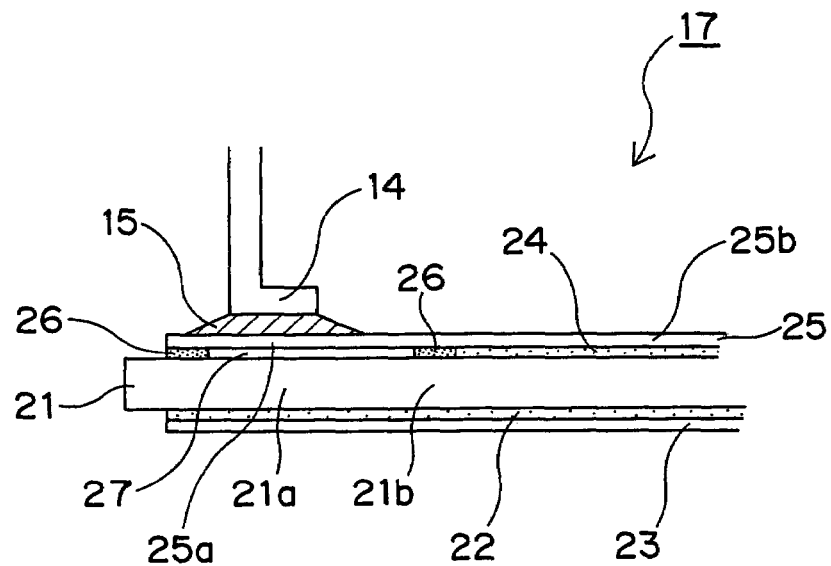
FIG. 4 is an enlarged sectional view illustrating an essential part of a structure of an insulating substrate of a semiconductor power module according to a second embodiment of the present invention.

The second embodiment of the present invention will now be explained with reference to FIGS. 4 and 5. FIG. 4 is a partially enlarged sectional view illustrating a basic structure of an insulating substrate 17 of a semiconductor power module according to the second embodiment of the present invention, and FIG. 5 is a perspective top plan view of FIG. 4.

The second embodiment of the present invention is a modified example of the first embodiment, and the basic structure thereof is similar to that of the first embodiment. The different point of the second embodiment resides in the fact that the first fixing member underneath the connected portion of the electrode terminal plate is provided only at peripheral portions thereof.

Figure 5:
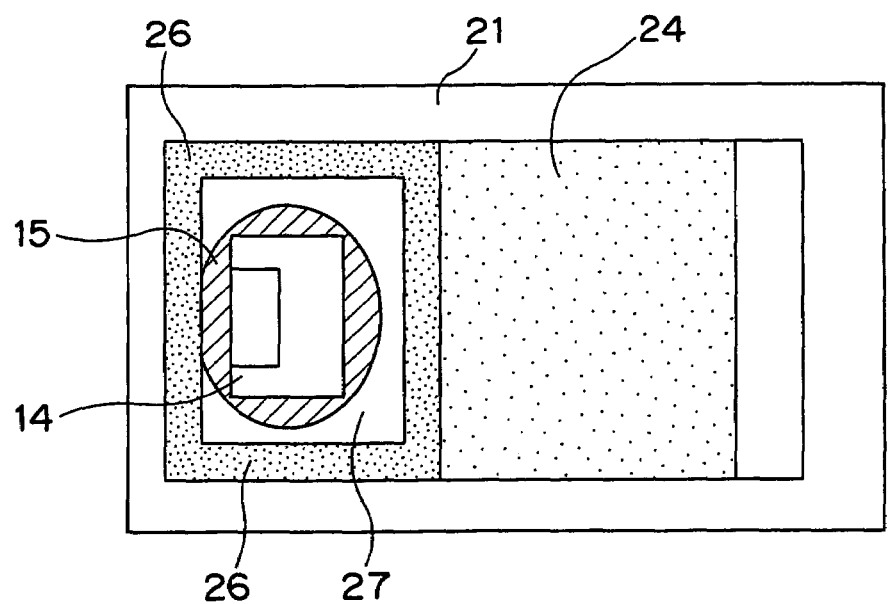
FIG. 5 is a perspective top plan view of an essential part of FIG. 4.

More particularly, as illustrated in FIGS. 4 and 5, a non-fixed clearance portion 27 having no fixing member 26 filled therein is formed in a central portion surrounded by the first fixing member 26 provided underneath the connected portion of the electrode terminal plate. In this insulating substrate structure 17, at the joint portion between the first conductive layer portion 25a and the first insulating body portion 21a of the plate-like insulating body 21, only the peripheral regions thereof is provided with the first fixing member 26 having a smaller fixing strength than that of the second fixing member 24 (i.e., upper fixing layer 24) while the central portion 27 thereof is formed as a non-fixed clearance portion.

In this construction, the first fixing member 26 and the second fixing member 24 are closely contacted with each other at their boundary portion so that the non-fixed clearance portion 27 is formed in a sealed condition with respect to an exterior of the module.

With this arrangement, it is possible to achieve the same effects as those of the first embodiment. Moreover, since the area for filling the first fixing member 26 of smaller fixing strength is further limited to only the peripheral portion thereof, there can be obtained an effect of preventing substances residues during the manufacturing process. In addition, it is further possible to arrange the electrode terminal plates with reduction in cost and weight.

Furthermore, since the insulating substrate is formed to have a stress relaxing structure, only the first fixing member 26 of a smaller fixing strength can be easily peeled when an initial stress is generated in usage of the product. Thus, only the first conductive layer portion 25a underneath the joint portion of the electrode terminal plate is allowed to partially separate from the plate-like insulating body 21, which exhibits the effect of reliably preventing breakage of the joint material portion 15 under the base portion 14b of the electrode terminal plate 14.

(Embodiment 3)

Figure 6:
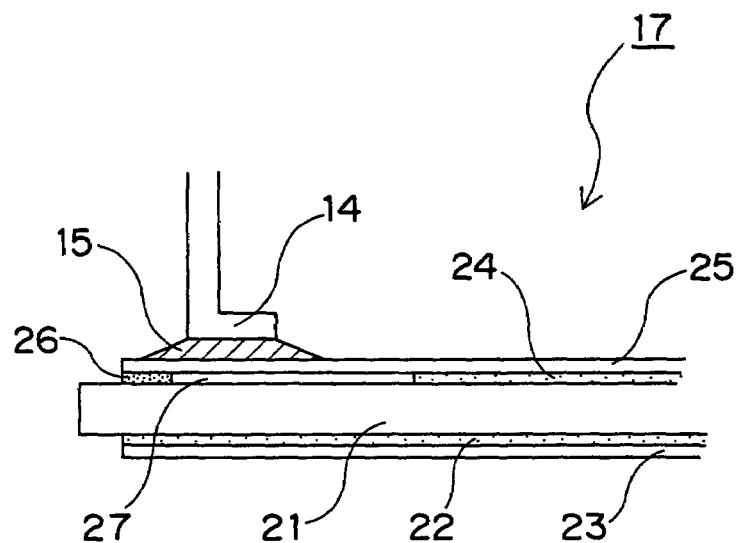
FIG. 6 is an enlarged sectional view illustrating an essential part of a structure of an insulating substrate of a semiconductor power module according to a third embodiment of the present invention.

The third embodiment of the present invention will now be explained with reference to FIGS. 6 and 7. FIG. 6 is a partially enlarged sectional view illustrating a basic structure of an insulating substrate of a semiconductor power module according to the third embodiment of the present invention, and FIG. 7 is a perspective top plan view thereof.

The third embodiment of the present invention is another modified example of the first embodiment. The basic structure thereof is similar to that of the second embodiment, where the different point thereof resides in the fact that, among the four peripheral portions provided with the first fixing member, the peripheral portion that is located at the boundary portion with respect to the second fixing member 24 is not provided with the first fixing member but only the remaining three peripheral portions are provided with the first fixing member 26.

Figure 7:
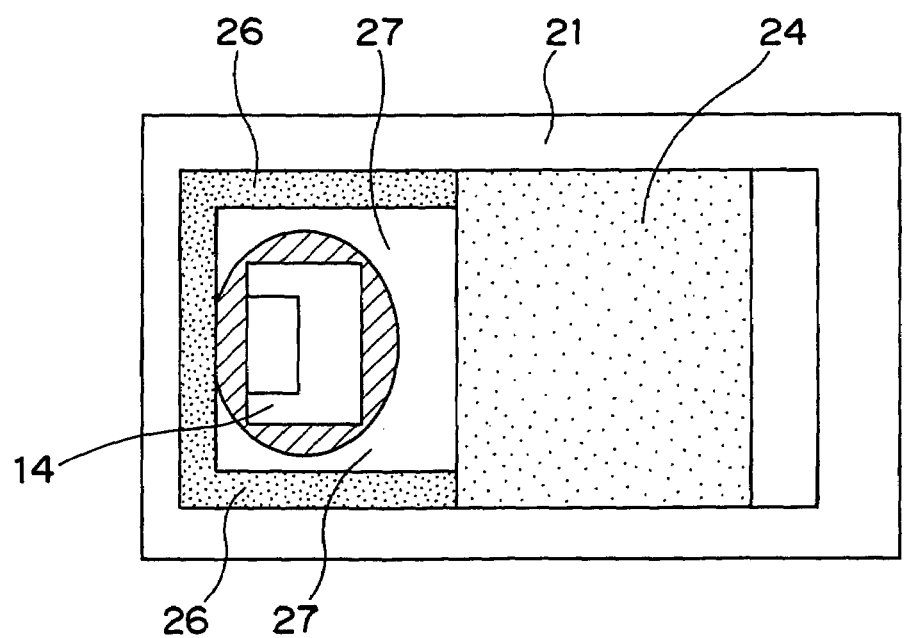
FIG. 7 is a perspective top plan view of an essential part of FIG. 6.

More particularly, as illustrated in FIGS. 6 and 7, the non-fixed clearance portion 27 having no fixing member filled therein is formed at a central portion of the joint fixing portion underneath the electrode terminal plate.

In this insulating substrate structure, in the joint portion between the first conductive layer portion 25a and the first insulating body portion 21a underneath the electrode terminal plate 14, only three peripheral portions among the four peripheral portions other than the peripheral portion located at the boundary portion with the second fixing member 24 are provided with the first fixing member 26 having a smaller fixing strength than that of the second fixing member 24. Meanwhile, the central portion 27 and the peripheral portion located at the boundary with the second fixing member 24 are formed as a non-fixed clearance portion.

With this arrangement, since the first fixing member of weak fixing strength is not provided at a boundary portion on the side that is strongly fixed by the second fixing member and that does not contribute to preventing residues of substances during a manufacturing process, it is possible to achieve the same effects as those of the second embodiment. Further the cost and weight can be reduced in arranging the electrode terminal plates and to achieve a stress relaxing effect in an initial design in which the first fixing member can be easily peeled when an initial stress is generated in the usage of the product.

(Embodiment 4)

Figure 8:
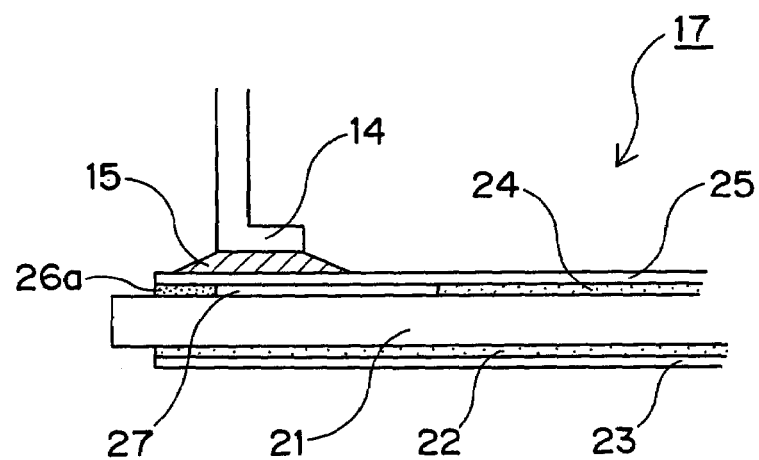
FIG. 8 is an enlarged sectional view illustrating an essential part of a structure of an insulating substrate of a semiconductor power module according to a fourth embodiment of the present invention.

The fourth embodiment of the present invention will now be explained with reference to FIGS. 8 and 9. FIG. 8 is a partially enlarged sectional view illustrating a basic structure of an insulating substrate of a semiconductor power module according to the fourth embodiment of the present invention, and FIG. 9 is a perspective top plan view thereof.

The fourth embodiment of the present invention is still another modified example of the first embodiment. The basic structure thereof is similar to that of the third embodiment, where the different point thereof resides in the fact that, the widths (that is, the areas) of the joint fixing portions of the three peripheral portions are defined to be different in size between the longitudinal portions and the lateral portion.

Figure 9:
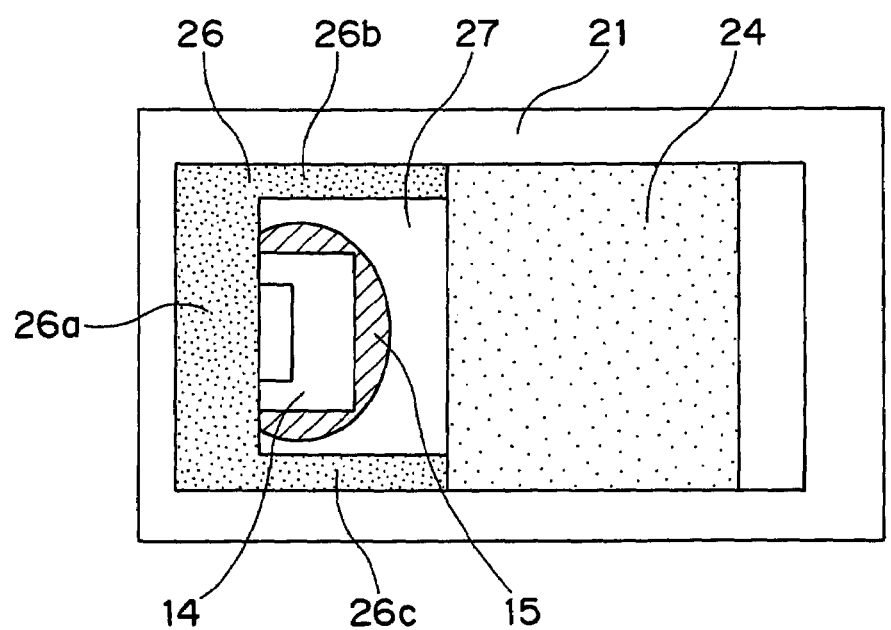
FIG. 9 is a perspective top plan view of an essential part of FIG. 8.

More particularly, as illustrated in FIGS. 8 and 9, the non-fixed clearance portion 27 having no fixing member 26 filled therein is formed at a central portion of the joint fixing portion underneath the connected region of the electrode terminal plate.

In the insulating substrate structure, only three peripheral portions among the four peripheral portions other than the peripheral portion located at the boundary portion with the second fixing member 24 are provided with the first fixing member 26 having a smaller fixing strength than that of the second fixing member 24, while the central portion 27 and the peripheral portion located at the boundary with the second fixing member 24 are formed as a non-fixed clearance portion, which is similar to the insulating substrate structure of the third embodiment.

In the fourth embodiment, the width (that is, the area) of the fixing portion 26a in the lateral direction among the first fixing members 26 provided at the three peripheral portions is made to be larger than the width (that is, the area) of the remaining two fixing portions 26b and 26c in the lengthwise direction.

It is, for instance, possible to employ an insulating substrate structure in which the width of the fixing portions 26b and 26c in the lengthwise direction is 1 mm while the width of the fixing portion 26a in the lateral direction is 3 mm.

The boundary portions between the two fixing members 26b and 26c in the lengthwise direction and the second fixing member 24 are closely contacted with each other so that the non-fixed clearance portion 27 is in a sealed condition with respect to the exterior.

Since a force applied during manufacturing processes is conventionally to be mainly applied to a side opposite to a side strongly fixed by the upper fixing layer 24, that is, a weakly fixed side by using the first fixing members provided on the end portion side, such portions would peel in the presence of a stress during manufacturing processes, and therefore substance residues are problematically caused during the manufacture.

In the arrangement of the fourth embodiment, the width (that is, the area) of the fixing portion 26a in the lateral direction provided on the end portion side that is opposite to the side strongly fixed by the second fixing member 24 is arranged to be larger than the width (that is, the area) of the remaining two fixing portions 26b and 26c in the lengthwise direction. Accordingly, it is possible to achieve the effects of the third embodiment and further to achieve the effects of preventing substance residues during manufacturing processes.

As described above, according to the present invention, the fixing strength between the electrode terminal plate and the insulating body portion is defined to be smaller than the joining strength of the fixing members of remaining regions so that reliable fixing is achieved during a manufacturing stage of the power module and no substances of manufacturing processes will remain.

A stress relaxing structure is further formed in which only the fixing member of weak fixing strength is easily peeled off in the presence of initial stress when using the product. With this arrangement, breakage of joint portions of the electrode terminal plates can be reliably prevented. Moreover, it is possible to omit forming a stress relaxing structure such as a S-shape at the electrode terminal plates, enabling to arrange the electrode terminal plates to be of low cost, and it is possible to provide a power module that is of a lower cost than those of the prior art.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor power module comprising:
   a metallic base;
   an insulating substrate fixedly laminated on the metallic base, the insulating substrate including a plate-like insulating body and a surface conductive layer fixedly laminated on a surface of the plate-like insulating body via a surface side fixing member;
   a power semiconductor element mounted on the insulating substrate; and
   an electrode terminal plate fixed to the insulating substrate via a joint portion,
   wherein the surface side fixing member includes a first fixing portion for fixing one part of the surface conductive layer located underneath the joint portion of the electrode terminal, the first fixing portion formed of a first material including a metal, and a second fixing portion for fixing the other part of the surface conductive layer which is not located underneath the joint portion, and
   wherein a fixing strength exhibited by the first fixing portion is smaller than that exhibited by the second fixing portion.

2. The semiconductor power module as claimed in claim 1, wherein the first fixing portion is formed by providing a fixing member only on its peripheral portions while its central portion is formed as an unfixed clearance portion.

3. The semiconductor power module as claimed in claim 1, wherein a boundary portion between the first fixing portion and the second fixing portion is tightly sealed.

4. The semiconductor power module as claimed in claim 2, wherein a boundary portion between the first fixing portion and the second fixing portion is tightly sealed.

5. The semiconductor power module as claimed in claim 1, wherein the first fixing portion is quadrangular having four peripheral portions, and one of the four peripheral portions located at a boundary portion with respect to the second fixing portion is not provided with a fixing member but only the remaining three peripheral portions are provided with the fixing member while its central portion is formed as an unfixed clearance portion.

6. The semiconductor power module as claimed in claim 5, wherein in the three peripheral portions of the first fixing portion, a width of an opposite peripheral portion located on an opposite side of the boundary with respect to the second fixing portion is larger than a width of the remaining two peripheral portions of the first fixing portion.

7. A semiconductor power module comprising:
   a metallic base;
   an insulating substrate fixedly laminated on the metallic base, the insulating substrate including a plate-like insulating body and a surface conductive layer fixedly laminated on a surface of the plate-like insulating body via a surface side fixing member;
   a power semiconductor element mounted on the insulating substrate; and
   an electrode terminal plate fixed to the insulating substrate via a joint portion,
   wherein the surface side fixing member includes a first fixing portion for fixing one part of the surface conductive layer located underneath the joint portion of the electrode terminal, and a second fixing portion for fixing the other part of the surface conductive layer which is not located underneath the joint portion,
   a fixing strength exhibited by the first fixing portion is smaller than that exhibited by the second fixing portion, and
   the first fixing portion is quadrangular having four peripheral portions, and one of the four peripheral portions located at a boundary portion with respect to the second fixing portion is not provided with a fixing member but only the remaining three peripheral portions are provided with the fixing member while its central portion is formed as an unfixed clearance portion.

8. The semiconductor power module as claimed in claim 7, wherein in the three peripheral portions of the first fixing portion, a width of an opposite peripheral portion located on an opposite side of the boundary with respect to the second fixing portion is larger than a width of the remaining two peripheral portions of the first fixing portion.

* * * * *